(12) United States Patent
Xu et al.

(10) Patent No.: US 12,166,089 B2
(45) Date of Patent: *Dec. 10, 2024

(54) METHOD OF MANUFACTURING SEMICONDUCTOR DEVICE AND ASSOCIATED MEMORY DEVICE

(71) Applicant: TAIWAN SEMICONDUCTOR MANUFACTURING COMPANY LTD., Hsinchu (TW)

(72) Inventors: Nuo Xu, Milpitas, CA (US); Zhiqiang Wu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/352,289

(22) Filed: Jul. 14, 2023

(65) Prior Publication Data

US 2023/0361182 A1    Nov. 9, 2023

Related U.S. Application Data

(63) Continuation of application No. 17/749,165, filed on May 20, 2022, now Pat. No. 11,769,804, which is a continuation of application No. 16/943,858, filed on Jul. 30, 2020, now Pat. No. 11,342,422.

(51) Int. Cl.
| | | |
|---|---|---|
| G11C 11/00 | (2006.01) | |
| G11C 11/22 | (2006.01) | |
| H01L 21/28 | (2006.01) | |
| H01L 29/51 | (2006.01) | |
| H01L 29/66 | (2006.01) | |
| H01L 29/78 | (2006.01) | |
| H10B 51/20 | (2023.01) | |
| H10B 51/30 | (2023.01) | |

(52) U.S. Cl.
CPC ...... *H01L 29/40111* (2019.08); *G11C 11/221* (2013.01); *G11C 11/223* (2013.01); *H01L 29/512* (2013.01); *H01L 29/513* (2013.01); *H01L 29/66666* (2013.01); *H01L 29/66795* (2013.01); *H01L 29/6684* (2013.01); *H01L 29/78391* (2014.09); *H10B 51/20* (2023.02); *H10B 51/30* (2023.02); *G11C 11/2259* (2013.01); *H01L 29/517* (2013.01); *H01L 29/785* (2013.01); *H01L 29/7853* (2013.01)

(58) Field of Classification Search
CPC .. G11C 11/221; G11C 11/223; G11C 11/2259
See application file for complete search history.

(56) References Cited

U.S. PATENT DOCUMENTS

| | | | | |
|---|---|---|---|---|
| 10,192,877 | B2 * | 1/2019 | Norizuki | H10B 41/10 |
| 11,342,422 | B2 * | 5/2022 | Xu | G11C 11/223 |
| 11,769,804 | B2 * | 9/2023 | Xu | G11C 11/221 |
| | | | | 365/145 |
| 11,830,875 | B2 * | 11/2023 | Chuang | H01L 29/41791 |
| 2017/0110562 | A1 * | 4/2017 | Chen | H01L 29/7397 |

\* cited by examiner

*Primary Examiner* — Pho M Luu
(74) *Attorney, Agent, or Firm* — WPAT LAW; Anthony King

(57) ABSTRACT

A method includes: providing a substrate including a planar portion and a mesa portion over the planar portion; depositing an oxide layer over the mesa portion; depositing a ferroelectric material strip over the oxide layer and aligned with the mesa portion; and depositing a gate strip crossing the ferroelectric material strip and over the oxide layer.

20 Claims, 21 Drawing Sheets

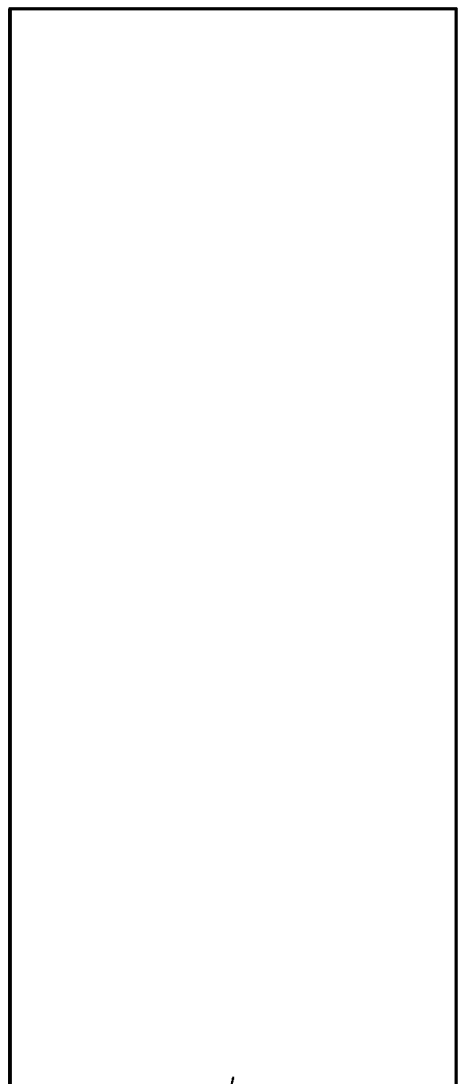

METHOD OF MANUFACTURING SEMICONDUCTOR DEVICE AND ASSOCIATED MEMORY DEVICE

CROSS REFERENCE TO RELATED APPLICATIONS

This application is a continuation of U.S. patent application Ser. No. 17/749,165 filed May 20, 2022, now U.S. Pat. No. 11,769,804, which is a continuation of U.S. patent application Ser. No. 16/943,858, filed Jul. 30, 2020, now U.S. Pat. No. 11,342,422 B2, which disclosures are hereby incorporated herein by reference.

BACKGROUND

In traditional NAND-type memory adopting ferroelectric field effect transistors (FeFETs), the read margin is small due to the intrinsic high variability originating from ferroelectric material grain/domains. In addition, the IR drop is very high which causes a low read/program speed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A to 3H are diagrams illustrating a flow of manufacturing a semiconductor device in accordance with an embodiment of the present disclosure.

DETAILED DESCRIPTION

Figure 1:
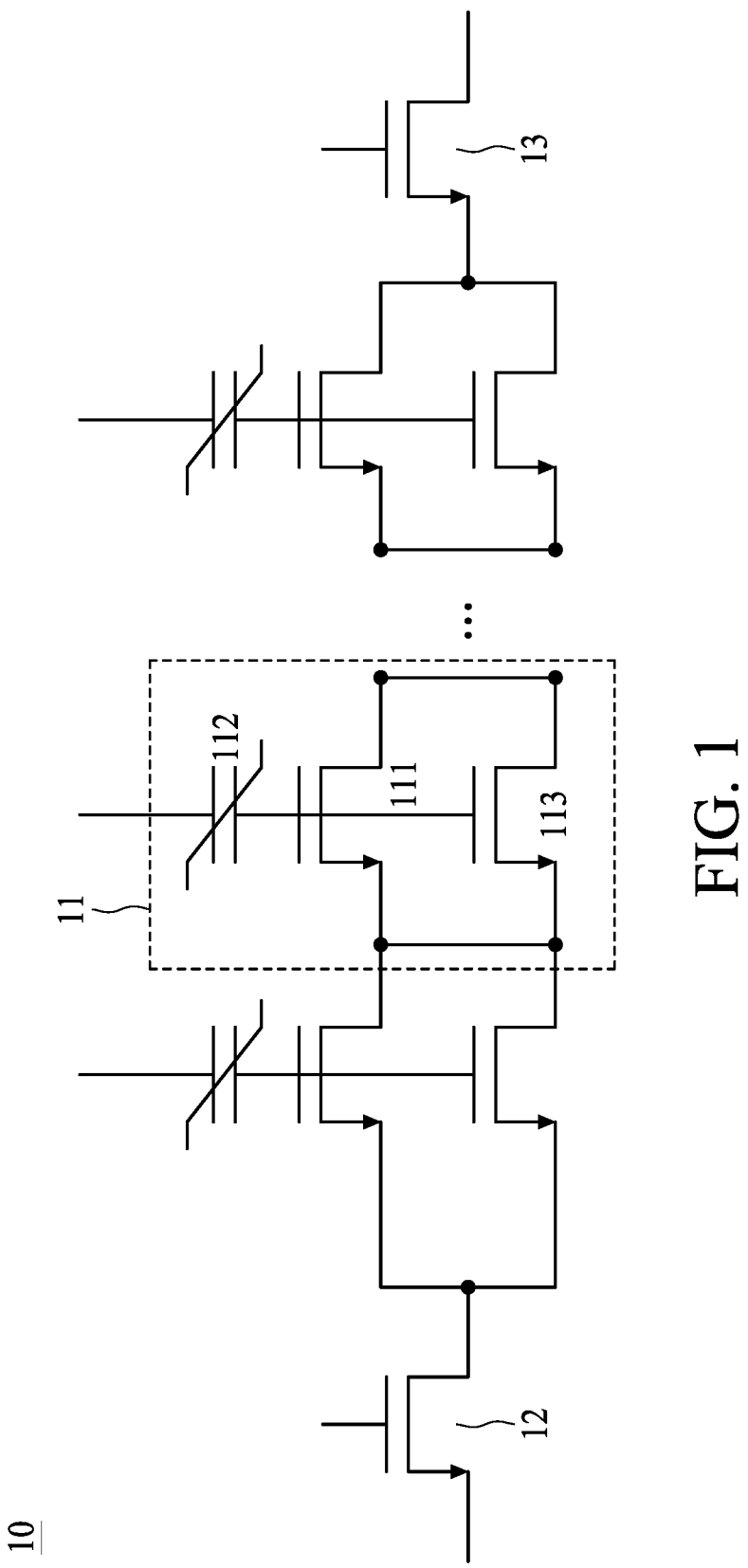
FIG. 1 is a diagram illustrating a memory device in accordance with an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a diagram illustrating a memory device 10 in accordance with an embodiment of the present disclosure. In some embodiments of the present disclosure, the memory device 10 is a non-volatile memory. In some embodiments of the present disclosure, the memory device 10 is an NAND memory device including an NAND string. The memory device 10 includes a plurality of memory cells 11 connected in series. Each memory cell 11 includes a first transistor 111, a second transistor 113 and a capacitor 112. In this embodiment, the memory device 10 is a ferroelectric based memory. With such configurations, the first transistor 111 is a ferroelectric field effect transistor (FeFET) and the capacitor 112 is a ferroelectric capacitor (FeCAP).

A gate terminal of the first transistor 111 is connected to a gate terminal of the second transistor 113. A source terminal of the first transistor 111 is connected to a source terminal of the second transistor 113. A drain terminal of the first transistor 111 is connected to a drain terminal of the second transistor 113. In other words, the first transistor 111 and the second transistor 113 share gate terminal, source terminal and drain terminal. One terminal of the capacitor 112 is connected to the gate terminal of the first transistor 111, and the other terminal of the capacitor 112 is directed to a voltage source, wherein the signal generated by the voltage source determines whether the memory cell 11 is selected to be accessed.

The memory device 10 further includes selection transistors 12 and 13 respectively connected at both ends of the plurality of memory cells 11. Those skilled in the art should readily understand the operation of an NAND memory. The detailed description of the access of the memory device 10 is omitted here for brevity.

By adopting another transistor (i.e., the second transistor 113) which shares the gate terminal, the source terminal and the drain terminal with the FeFET (i.e., the first transistor 111), the current flowing through the plurality of memory cells 11 is enlarged. With such configurations, the memory device 10 proposed by this present disclosure can reach a high access speed (i.e., the read speed and the write speed).

Figure 2:
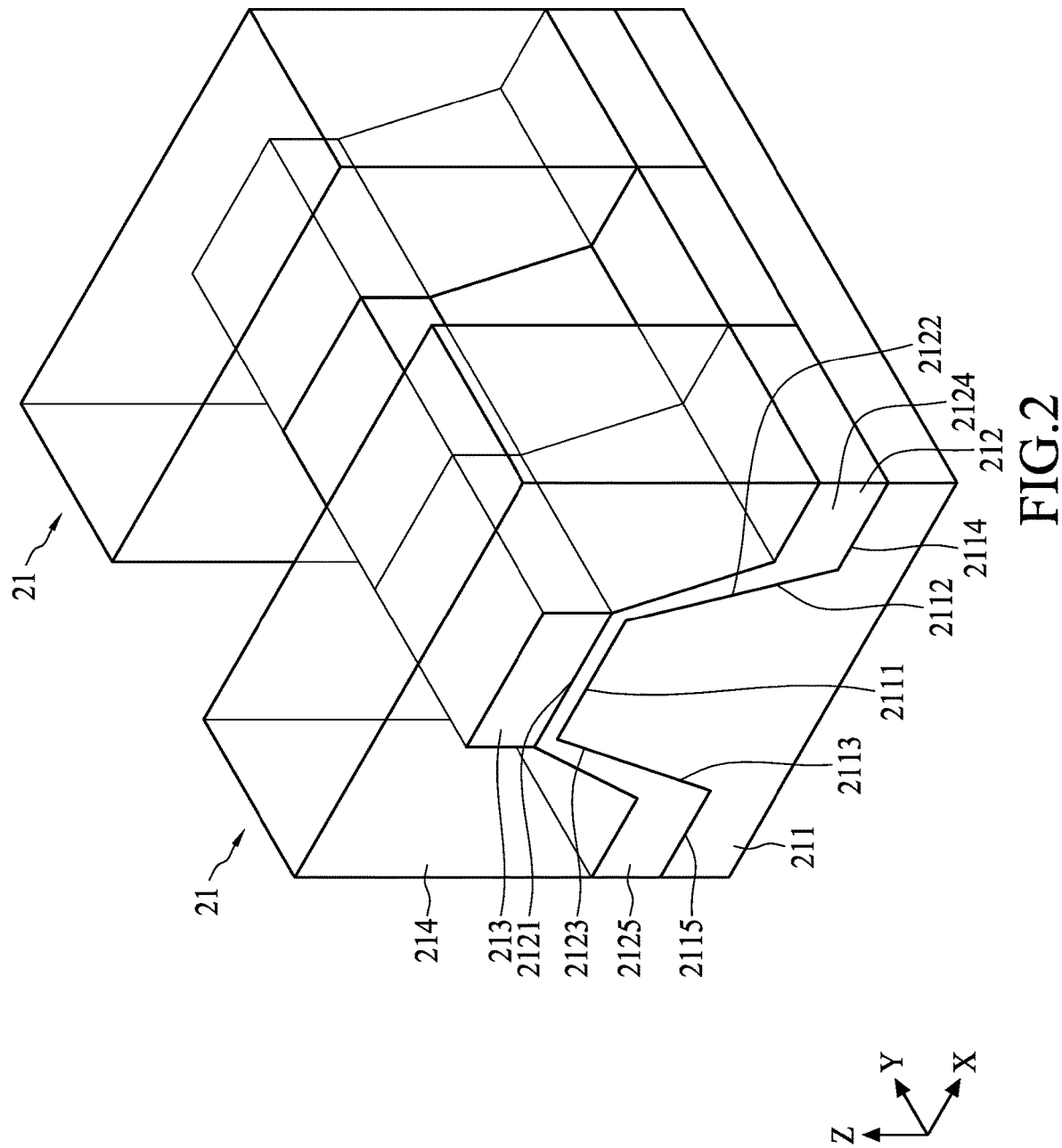
FIG. 2 is a diagram illustrating a part of a semiconductor device in accordance with an embodiment of the present disclosure.

FIG. 2 is a diagram illustrating a portion of a semiconductor device 20 in accordance with an embodiment of the present disclosure. In some embodiments of the present disclosure, the semiconductor device 20 is a non-volatile memory. In some embodiments of the present disclosure, the semiconductor device 20 is an NAND memory device including an NAND string. In some embodiments of the present disclosure, the semiconductor device 20 can be implemented by the memory device 10 described in the embodiment of FIG. 1, that is, the semiconductor device 20 also includes a plurality of memory cells 21 connected in series.

It should be noted that only a portion of the plurality of memory cells 21 is shown in FIG. 2. Each memory cell 21 includes a substrate 211, an oxide layer 212, a ferroelectric strip 213 extending in a first direction (e.g., y direction), and a gate strip 214 extending in a second direction (e.g., x direction).

In some embodiments of the present disclosure, the substrate 211 is a semiconductor substrate such as e.g. a silicon, a gallium arsenide (GaAs), a gallium arsenide phosphide (GaAsP), an indium phosphide (InP), a germanium (Ge), or a silicon germanium (SiGe) substrate. In other embodiments the substrate 211 may include for example, an insulating layer such as a SiO2 or a Si3N4 layer in addition to a semiconductor substrate portion. Thus, the term substrate 211 also includes silicon-on-glass, silicon-on-sapphire substrates. Also, the substrate 211 may be any other base on which a layer is formed, for example a glass or metal layer. Accordingly, a substrate 211 may be a wafer such as a blanket wafer or may be a layer applied to another base material, e.g. an epitaxial layer grown onto a lower layer.

The material of the oxide layer 212 may include, but is not limited to, metal oxide. The metal oxide may include binary metal oxide such as hafnium oxide, tantalum oxide, aluminum oxide, nickel oxide, titanium oxide or the like. The metal oxide may include trinary metal oxide such as hafnium tantalum oxide, hafnium aluminum oxide, aluminum tantalum oxide or the like.

The material of the gate strip 214 includes, but is not limited to, polysilicon or a metal. The metal for the gate strip 214 may be chosen from a group consisting of Cu, Al, Ti, W, Ni, Au, TiN, TaN, TaC, NbN, RuTa, Co, Ta, Mo, Pd, Pt, Ru, Ir and Ag, to name a few.

The substrate 211 includes a channel region for conducting current. The substrate 211 includes a protruding plane 2111, side planes 2112 and 2113, and bottom planes 2114 and 2115. The side plane 2112 is connected between the protruding plane 2111 and the bottom plane 2114. The side plane 2113 is connected between the protruding plane 2111 and the bottom plane 2115.

In some embodiments of the present disclosure, the angle between the side plane 2112 (or the side plane 2113) and the bottom plane 2114 (or the bottom plane 2115) ranges from 70 to 90 degrees. In some embodiments of the present disclosure, the length of the side plane 2112 (or the side plane 2113) along a direction from the protruding plane 2111 to the bottom plane 2114 (or the bottom plane 2115) ranges from 15 to 80 nm. In some embodiments of the present disclosure, the length of the bottom plane 2114 (or the bottom plane 2115) along the second direction (e.g., x direction) ranges from 15 to 50 nm. In some embodiments of the present disclosure, a length of the protruding plane 2111 along the second direction (e.g., x direction) ranges from 15 to 50 nm.

In some embodiments, the substrate 211 is symmetrical. That is, the parameters of the side plane 2112 and the bottom plane 2114 are identical to the parameters of the side plane 2113 and the bottom plane 2115. However, this is not a limitation of the present disclosure. In other embodiments, the substrate 211 is asymmetrical.

The oxide layer 212 is formed on the substrate 211. Therefore, the oxide layer 212 includes a protruding plane 2121, side planes 2122 and 2123, and bottom planes 2124 and 2125. In some embodiments of the present disclosure, the thickness of the protruding plane 2121 ranges from 1 to 6 nm. In some embodiments of the present disclosure, the thickness of the side plane 2122 (or the side plane 2123) ranges from 1 to 6 nm. In some embodiments of the present disclosure, the thickness of the bottom plane 2124 (or the bottom plane 2125) ranges from 15 to 50 nm.

Those skilled in the art should readily understand that the gate strip 214 defines the gate terminal of the transistor. Moreover, the regions between two memory cells 21 can be doped to form the source region or the drain region of a transistor.

The gate strip 214, the ferroelectric material strip 213, the oxide layer 212 (especially, the protruding plane 2121 of the oxide layer 212) and the substrate 211 constitute a FeFET and a FeCAP. The gate strip 214, the oxide layer 212 (especially the side plane 2122 of the oxide layer 212) and the substrate 211 constitute another transistor which shares the gate terminal, the source terminal and the drain terminal with the FeFET. Therefore, the transistor whose gate terminal is composed by the gate strip 214, the oxide layer 212 (especially, the side plane 2122 of the oxide layer 212) and the substrate 211 can be considered as the second transistor 113 shown in FIG. 1.

FIG. 3A to FIG. 3H are diagrams illustrating a flow of manufacturing of a memory cell 31 of a semiconductor device 30 in accordance with an embodiment of the present disclosure. In some embodiments of the present disclosure, the semiconductor device 30 is a non-volatile memory. In some embodiments of the present disclosure, the semiconductor device 30 is an NAND memory device including an NAND string. In some embodiments of the present disclosure, the memory cell 31 of the semiconductor device 30 can be implemented by memory cell 21 of the semiconductor device 20 described in the embodiment of FIG. 2.

In FIG. 3A, a substrate 311 is provided. In some embodiments of the present disclosure, the substrate 311 is a semiconductor substrate such as e.g. a silicon, a gallium arsenide (GaAs), a gallium arsenide phosphide (GaAsP), an indium phosphide (InP), a germanium (Ge), or a silicon germanium (SiGe) substrate. In other embodiments the substrate 311 may include for example, an insulating layer such as a SiO2 or a Si3N4 layer in addition to a semiconductor substrate portion. Thus, the term substrate 311 also includes silicon-on-glass, silicon-on-sapphire substrates. Also, the substrate 311 may be any other base on which a layer is formed, for example a glass or metal layer. Accordingly, a substrate 311 may be a wafer such as a blanket wafer or may be a layer applied to another base material, e.g. an epitaxial layer grown onto a lower layer.

Figure 3B:
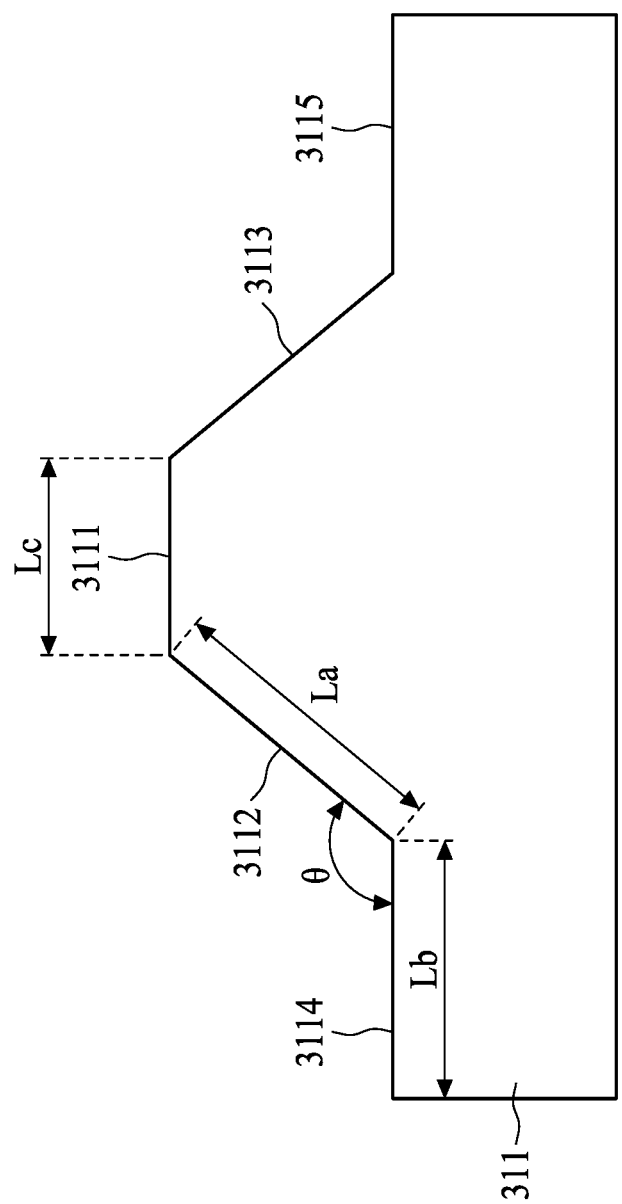

In FIG. 3B, the substrate 311 is shaped to form a protruding plane 3111, side planes 3112 and 3113, and bottom planes 3114 and 3115. In some embodiments of the present disclosure, the substrate 311 is shaped by, for example, a photolithography operation.

In some embodiments of the present disclosure, an angle θ between the side plane 3112 and the bottom plane 3114 ranges from 70 to 90 degrees. In some embodiments of the present disclosure, a length La of the side plane 3112 ranges from 15 to 80 nm. In some embodiments of the present disclosure, a length Lb of the bottom plane 3114 ranges from 15 to 50 nm. In some embodiments of the present disclosure, a length Lc of the protruding plane 3111 along x direction ranges from 15 to 50 nm.

Figure 3C:
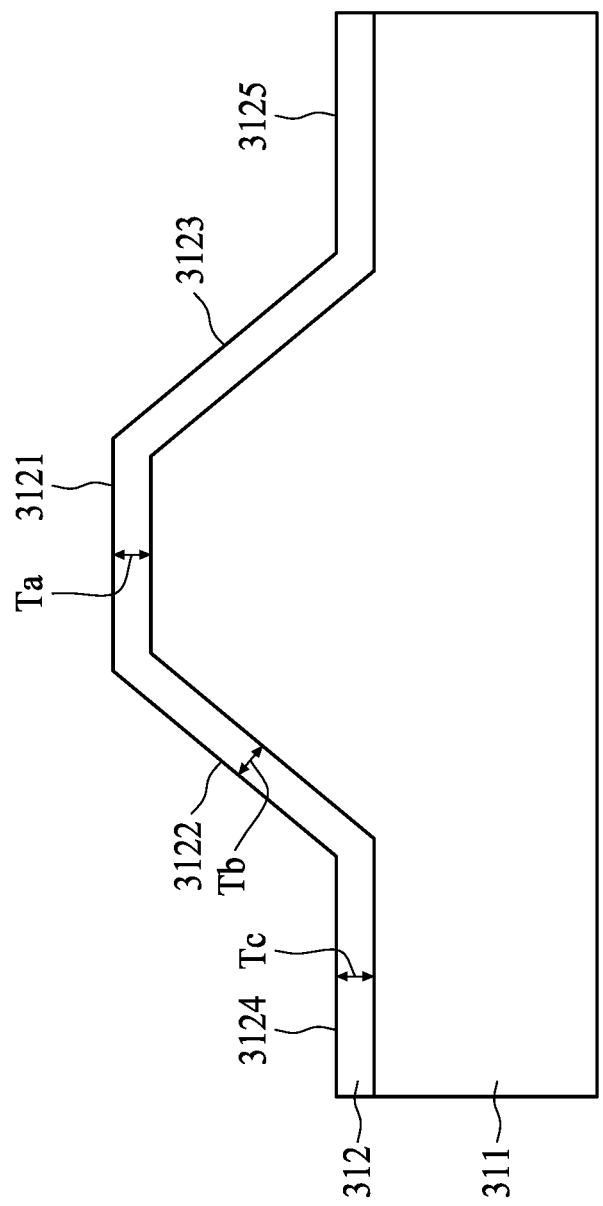

In FIG. 3C, an oxide layer 312 is formed on the substrate 311. In some embodiments of the present disclosure, the oxide layer 312 is formed by, for example, an electroplate operation. In some embodiments of the present disclosure, the oxide layer 312 is formed, for example, atomic layer deposition (ALD), physical vapor deposition (PVD), chemical vapor phase deposition (CVD), more preferably, low pressure CVD (LPCVD) or alternatively plasma enhanced CVD (PECVD).

The material of the oxide layer 312 may include, but is not limited to, metal oxide. The metal oxide may include binary metal oxide such as hafnium oxide, tantalum oxide, aluminum oxide, nickel oxide, titanium oxide or the like. The metal oxide may include trinary metal oxide such as hafnium tantalum oxide, hafnium aluminum oxide, aluminum tantalum oxide or the like.

The oxide layer 312 includes a protruding plane 3121, side planes 3122 and 3123, and bottom planes 3124 and 3125. In some embodiments of the present disclosure, a thickness Ta of the protruding plane 3121 ranges from 1 to 6 nm. In some embodiments of the present disclosure, a thickness Tb of the side plane 3122 ranges from 1 to 6 nm. In some embodiments of the present disclosure, a thickness Tc of the bottom plane 3124 ranges from 15 to 50 nm.

Figure 3D:
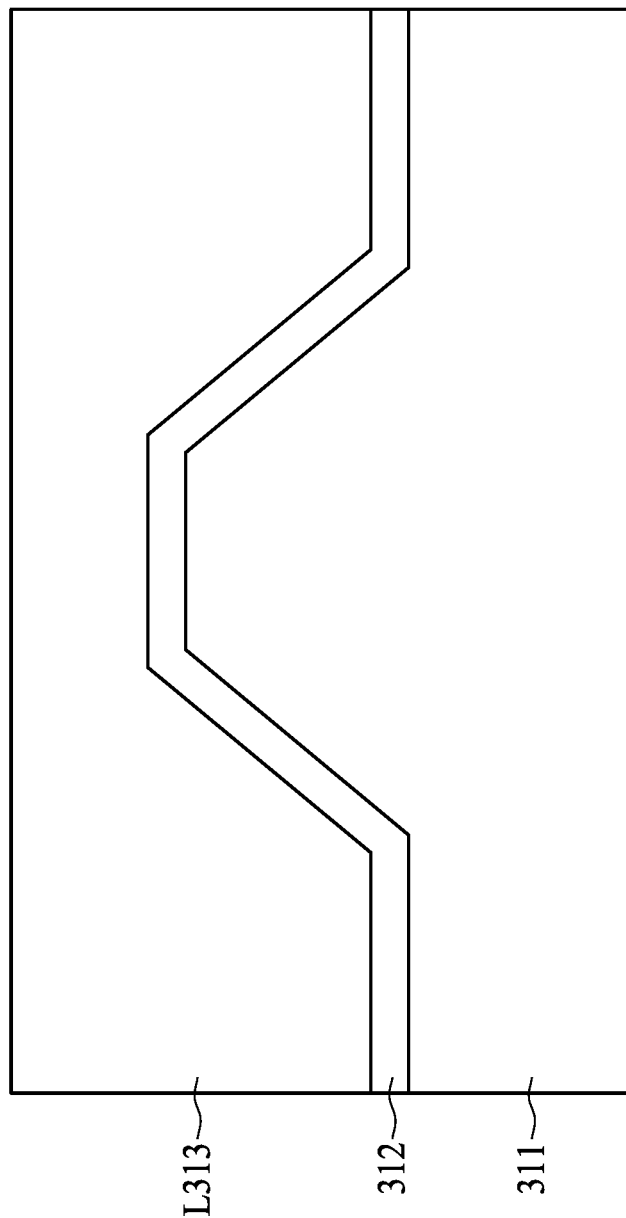
Figure 3E:
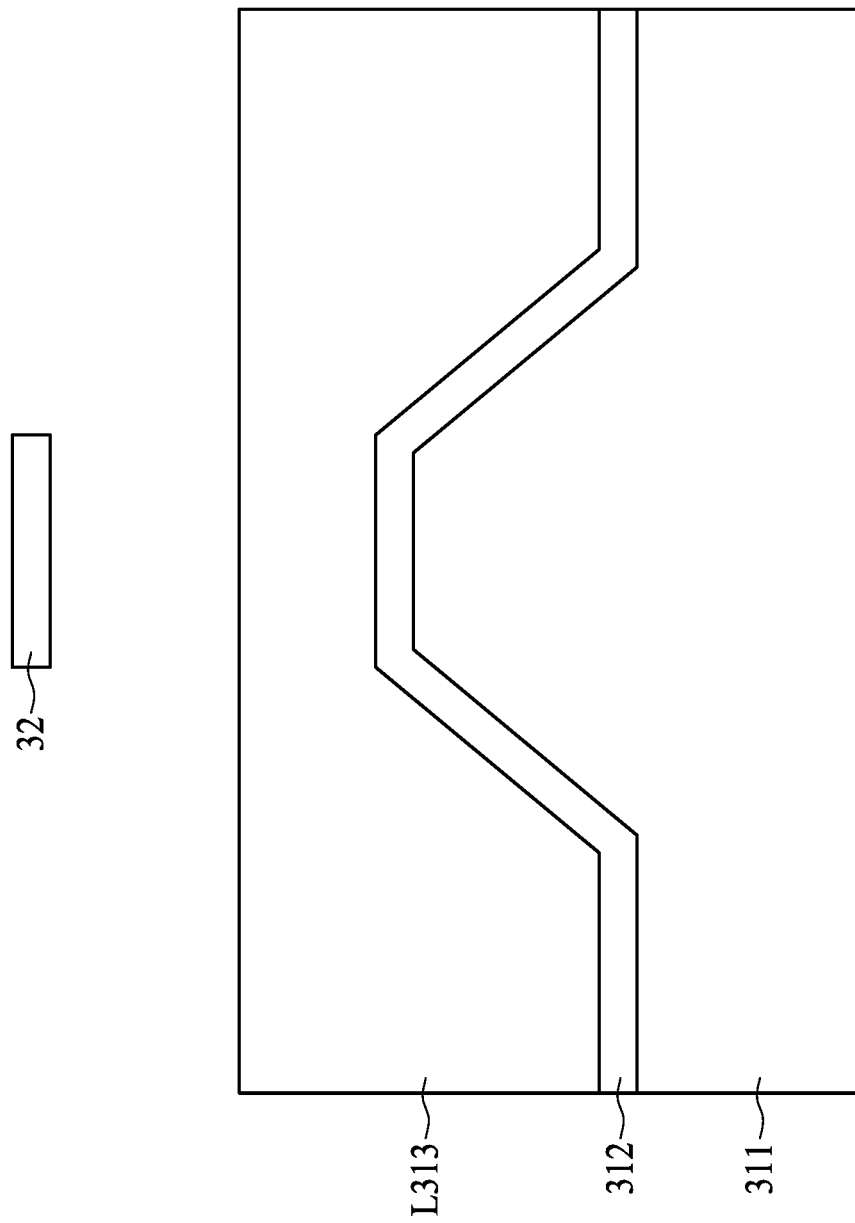
Figure 3F:
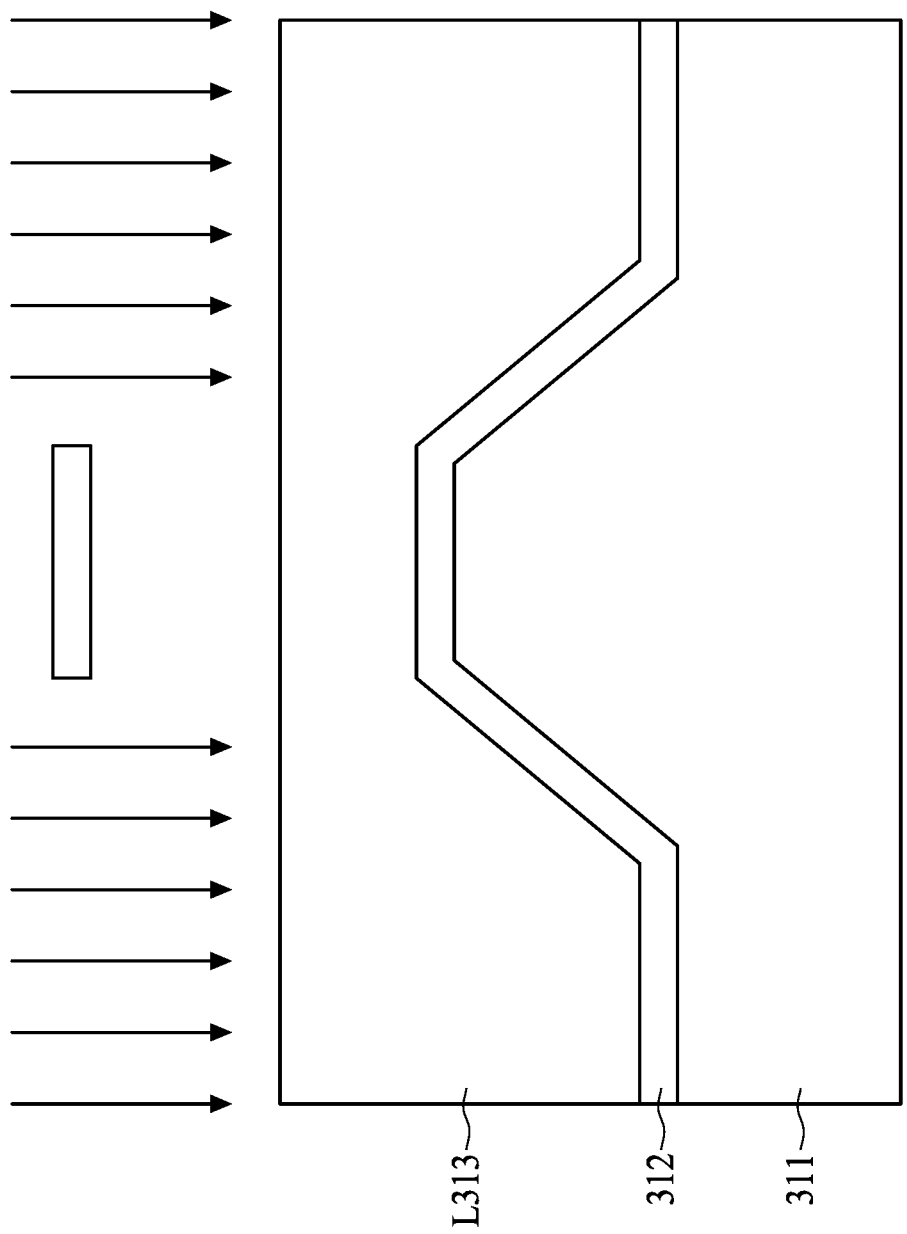
Figure 3G:
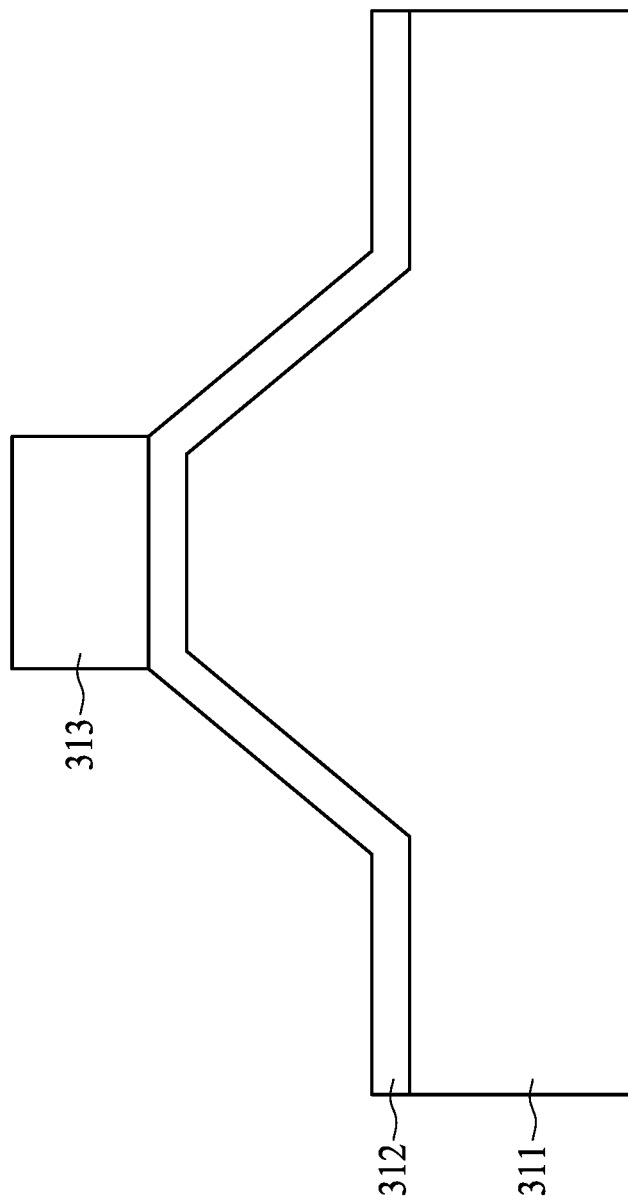

In FIG. 3D, a ferroelectric material layer L313 is deposited on the oxide layer 312. In FIG. 3E, a photomask 32 is disposed above the ferroelectric material layer L313. Specifically, the photomask 32 is disposed over the protruding plane 3121 of the oxide layer 312. In FIG. 3F, a photolithography operation such like a dry etching is executed to etch a part of the ferroelectric material layer L313 which is not covered by the photomask 32. In FIG. 3G, a ferroelectric material strip 313 is formed on the protruding plane 3121 of the oxide layer 312.

Figure 3H:
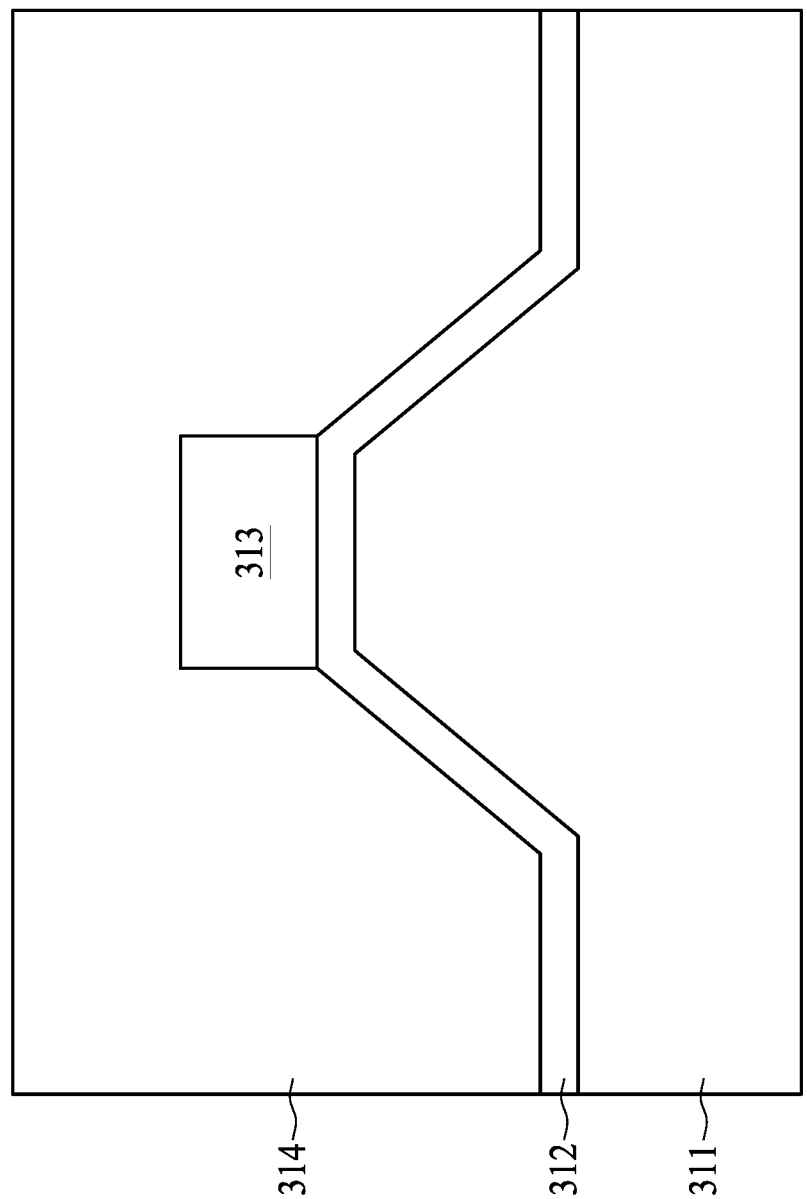

In FIG. 3H, a gate strip 314 is formed on the oxide layer 312 and the ferroelectric material strip 313. The material of the gate strip 314 includes, but is not limited to, polysilicon or a metal. The metal for the gate strip 314 may be chosen from a group consisting of Cu, Al, Ti, W, Ni, Au, TiN, TaN, TaC, NbN, RuTa, Co, Ta, Mo, Pd, Pt, Ru, Ir and Ag, to name a few.

It should be noted that in FIGS. 3E to 3G, the ferroelectric material strip 313 is formed by photolithography operation. However, this is not a limitation of the present disclosure. In some embodiments of the present disclosure, the ferroelectric material can be electroplated on the protruding plane 3121 of the oxide layer 312 to form the ferroelectric material strip 313. In some embodiments of the present disclosure, the ferroelectric material strip 313 is formed, for example, atomic layer deposition (ALD), physical vapor deposition (PVD), chemical vapor phase deposition (CVD), more preferably, low pressure CVD (LPCVD) or alternatively plasma enhanced CVD (PECVD).

The gate strip 314, the ferroelectric material strip 313, the oxide layer 312 (especially, the protruding plane 3121 of the oxide layer 312) and the substrate 311 constitute a FeFET and a FeCAP. The gate strip 314, the oxide layer 312 (especially the side plane 3122 of the oxide layer 312) and the substrate 311 constitute another transistor which shares the gate terminal, the source terminal and the drain terminal with the FeFET. Therefore, the transistor whose gate terminal is composed by the gate strip 314, the oxide layer 312 (especially, the side plane 3122 of the oxide layer 312) and the substrate 311 can be considered as the second transistor 113 shown in FIG. 1.

Figure 4:
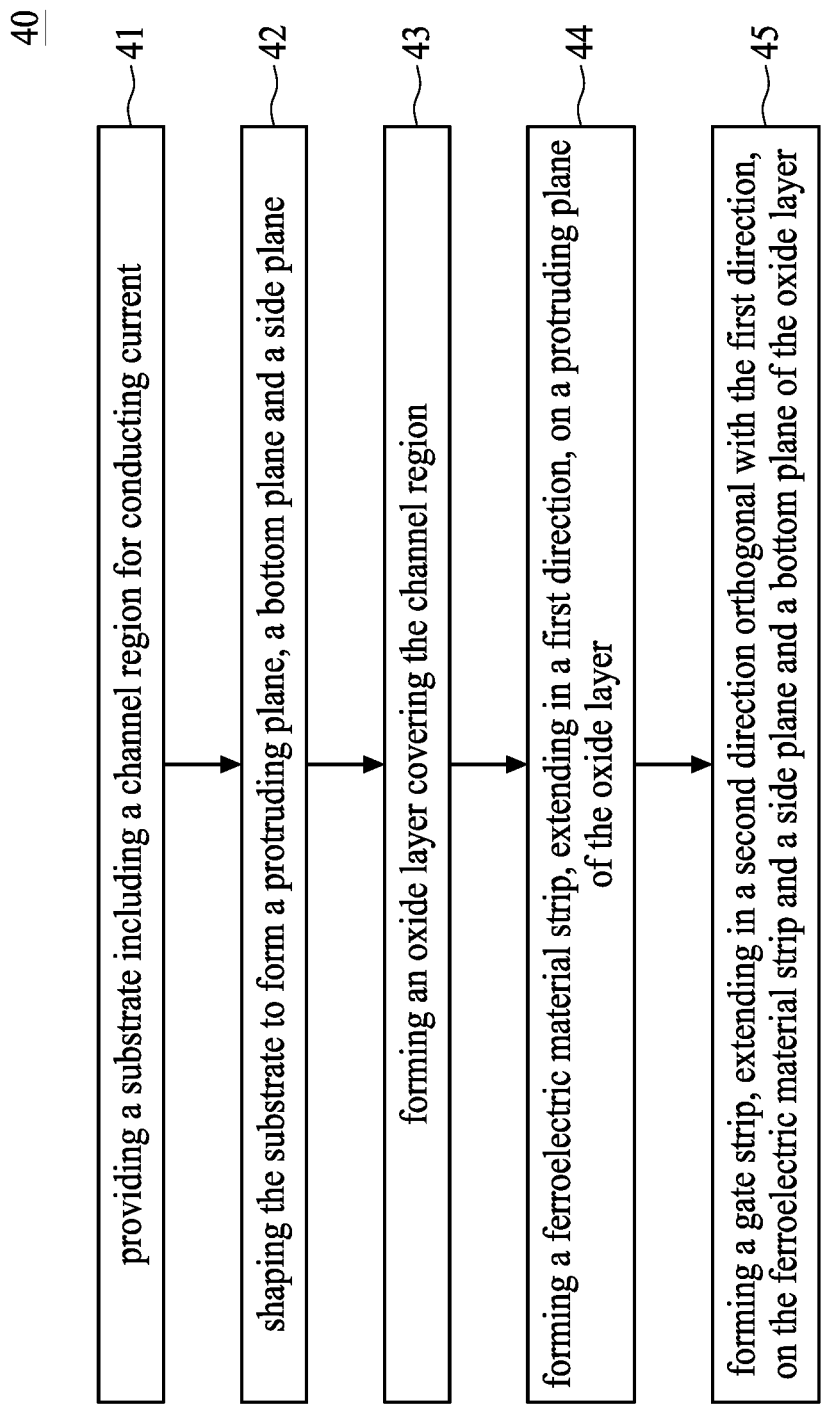
FIG. 4 is a flowchart illustrating a method of manufacturing a semiconductor device in accordance with an embodiment of the present disclosure.

FIG. 4 is a flowchart illustrating a method 40 of manufacturing of a semiconductor device in accordance with an embodiment of the present disclosure. The method 40 can be adopted to manufacture the semiconductor device 30 described in the embodiments of FIGS. 3A to 3H. Provided that the results are substantially the same, the operations in method 40 are not required to be executed in the exact order. The method 40 is summarized as follows.

In Operation 41, a substrate including a channel region for conducting current is provided.

In some embodiments of the present disclosure, the substrate is a semiconductor substrate such as e.g. a silicon, a gallium arsenide (GaAs), a gallium arsenide phosphide (GaAsP), an indium phosphide (InP), a germanium (Ge), or a silicon germanium (SiGe) substrate. In other embodiments the substrate may include for example, an insulating layer such as a SiO2 or a Si3N4 layer in addition to a semiconductor substrate portion. Thus, the term substrate also includes silicon-on-glass, silicon-on-sapphire substrates. Also, the substrate may be any other base on which a layer is formed, for example a glass or metal layer. Accordingly, a substrate may be a wafer such as a blanket wafer or may be a layer applied to another base material, e.g. an epitaxial layer grown onto a lower layer. For example, the substrate can be the substrate 211 or the substrate 311 mentioned above.

In Operation 42, the substrate is shaped to form a protruding plane, a side plane and a bottom plane. For example, the substrate can be shaped by a photolithography operation. In some embodiments of the present disclosure, an angle between the side plane and the bottom plane ranges from 70 to 90 degrees. In some embodiments of the present disclosure, a length of the side plane along a direction from the protruding plane to the bottom plane ranges from 15 to 80 nm. In some embodiments of the present disclosure, a length of the bottom plane ranges from 15 to 50 nm. In some embodiments of the present disclosure, a length of the protruding plane along the second direction ranges from 15 to 50 nm.

In Operation 43, an oxide layer is formed to cover the channel region. The oxide layer includes a protruding plane, a side plane and a bottom plane. The oxide layer is formed by, for example, an electroplate operation. In some embodiments of the present disclosure, the material of the oxide layer may include, but is not limited to, metal oxide. The metal oxide may include binary metal oxide such as hafnium oxide, tantalum oxide, aluminum oxide, nickel oxide, titanium oxide or the like. The metal oxide may include trinary metal oxide such as hafnium tantalum oxide, hafnium aluminum oxide, aluminum tantalum oxide or the like.

In some embodiments of the present disclosure, the thickness of the protruding plane ranges from 1 to 6 nm. In some embodiments of the present disclosure, the thickness of the side plane ranges from 1 to 6 nm. In some embodiments of the present disclosure, the thickness of the bottom plane ranges from 15 to 50 nm. For example, the oxide layer can be the oxide layer 212 or the oxide layer 312 mentioned above.

In Operation 44, a ferroelectric material strip extending in a first direction is formed on the protruding plane of the oxide layer. The ferroelectric material strip is formed by, for example, an electroplate operation. For example, the ferroelectric material strip can be the ferroelectric material strip 213 or the ferroelectric material strip 313 mentioned above.

In Operation 45, a gate strip, extending in a second direction orthogonal with the first direction, is formed on the ferroelectric material strip and a side plane and a bottom plane of the oxide layer. The material of the gate strip includes, but is not limited to, polysilicon or a metal. The metal for the gate strip may be chosen from a group consisting of Cu, Al, Ti, W, Ni, Au, TiN, TaN, TaC, NbN, RuTa, Co, Ta, Mo, Pd, Pt, Ru, Ir and Ag, to name a few. For example, the gate strip can be the gate strip 214 or the gate strip 314.

Figure 5:
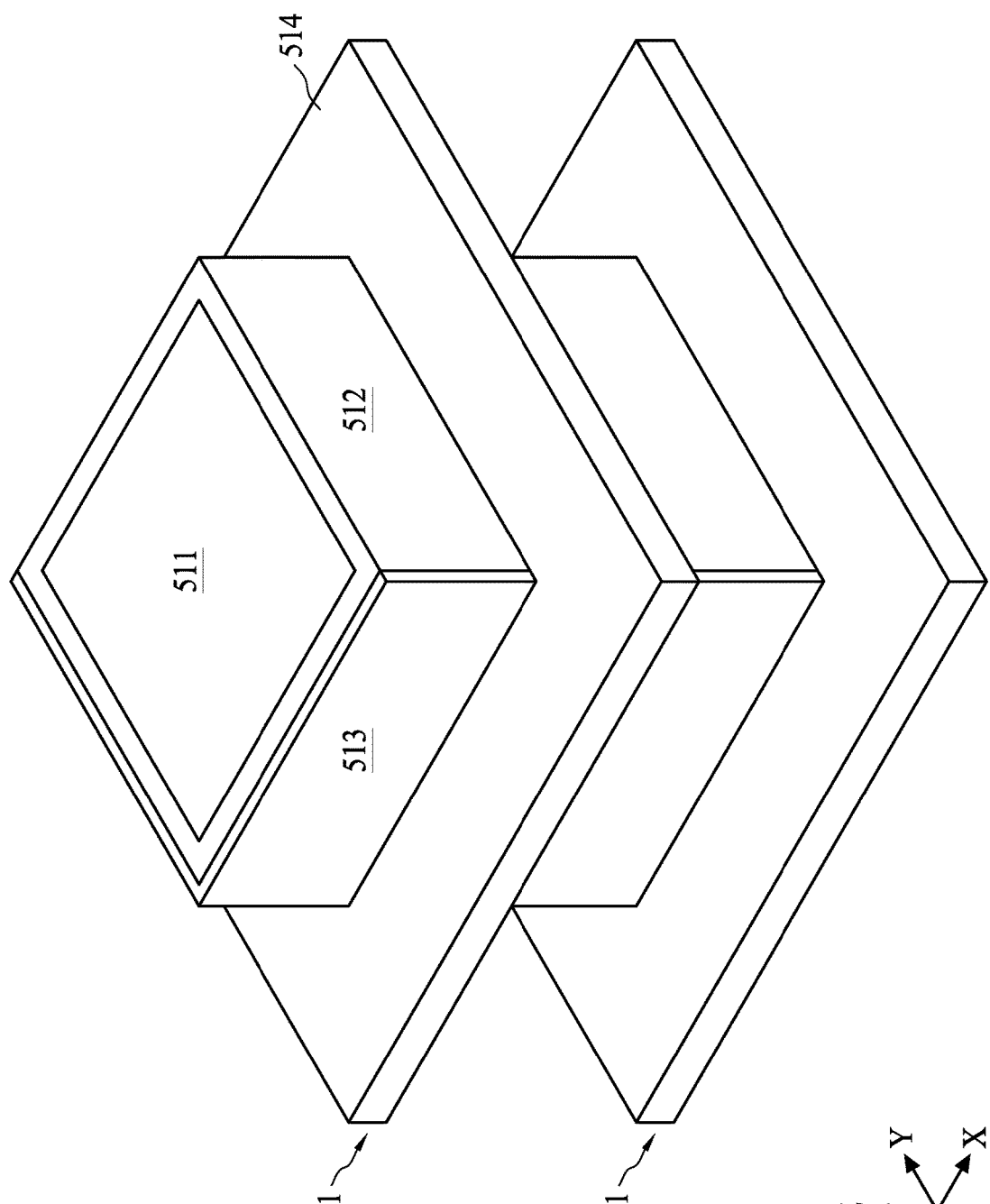
FIG. 5 is a diagram illustrating a part of a vertical three dimensional semiconductor device in accordance with an embodiment of the present disclosure.

FIG. 5 is a diagram illustrating a portion of a vertical three dimensional semiconductor device 50 in accordance with an embodiment of the present disclosure. In some embodiments of the present disclosure, the semiconductor device 50 is a non-volatile memory. In some embodiments of the present disclosure, the semiconductor device 50 is an NAND memory device including an NAND string. In some embodiments of the present disclosure, the semiconductor device 50 can be implemented by the memory device 10 described in the embodiment of FIG. 1, that is, the semiconductor device 50 also includes a plurality of memory cells 51 connected in series.

It should be noted that only a portion of the plurality of memory cells 51 is shown in FIG. 5. For example, the semiconductor device 50 further includes a substrate (not shown in FIG. 5) disposed on the bottom of the semiconductor device 50. That is, the plurality of memory cells 51 are formed on the substrate.

In some embodiments of the present disclosure, the substrate is a semiconductor substrate such as e.g. a silicon, a gallium arsenide (GaAs), a gallium arsenide phosphide (GaAsP), an indium phosphide (InP), a germanium (Ge), or a silicon germanium (SiGe) substrate. In other embodiments the substrate may include for example, an insulating layer such as a SiO2 or a Si3N4 layer in addition to a semiconductor substrate portion. Thus, the term substrate also includes silicon-on-glass, silicon-on-sapphire substrates. Also, the substrate may be any other base on which a layer is formed, for example a glass or metal layer. Accordingly, a substrate may be a wafer such as a blanket wafer or may be a layer applied to another base material, e.g. an epitaxial layer grown onto a lower layer.

Each memory cell 51 includes, from the inside to the outside, a channel layer 511, an oxide layer 512 surrounding the channel layer 511, a ferroelectric material layer 513 partially surrounding the oxide layer 512, and a gate electrode layer encircling the channel layer 511, the oxide layer 512 and the ferroelectric material layer 513.

In some embodiments of the present disclosure, the material of the oxide layer 512 may include, but is not limited to, metal oxide. The metal oxide may include binary metal oxide such as hafnium oxide, tantalum oxide, aluminum oxide, nickel oxide, titanium oxide or the like. The metal oxide may include trinary metal oxide such as hafnium tantalum oxide, hafnium aluminum oxide, aluminum tantalum oxide or the like.

In some embodiments of the present disclosure, the metal for the gate electrode layer 514 may be chosen from a group consisting of Cu, Al, Ti, W, Ni, Au, TiN, TaN, TaC, NbN, RuTa, Co, Ta, Mo, Pd, Pt, Ru, Ir and Ag, to name a few.

The gate electrode layer 514, the ferroelectric material layer 513, the oxide layer 512 and the channel layer 511 constitute a FeFET and a FeCAP. The gate electrode layer 514, the oxide layer 512 and the channel layer 511 constitute another transistor which shares the gate terminal, the source terminal and the drain terminal with the FeFET. Therefore, the transistor whose gate terminal is composed by the gate electrode layer 514, the oxide layer 512 and the channel layer 511 can be considered as the second transistor 113 shown in FIG. 1.

It should be noted that, in the embodiment of FIG. 5, the cross-sectional area of the channel layer 511 (or the oxide 512) is rectangular. However, this is not a limitation of the present disclosure. In other embodiments of the present disclosure, the cross-sectional area of the channel layer 511 (or the oxide 512) is circular.

In addition, in the embodiment of FIG. 5, the ferroelectric material layer 513 surrounds a half of the oxide later 512. However, this is not a limitation of the present disclosure. In other embodiments of the present disclosure, the ferroelectric material layer 513 surrounds 25% to 75% of the oxide later 512.

FIG. 6A to FIG. 6H are diagram illustrating a flow of manufacturing a vertical three dimensional semiconductor device 60 in accordance with an embodiment of the present disclosure. In some embodiments of the present disclosure, the semiconductor device 60 is a non-volatile memory. In some embodiments of the present disclosure, the semiconductor device 60 is an NAND memory device including an NAND string. In some embodiments of the present disclosure, the memory cell 61 of the semiconductor device 60 can be implemented by memory cell 51 of the semiconductor device 50 described in the embodiment of FIG. 5.

Figure 6A:
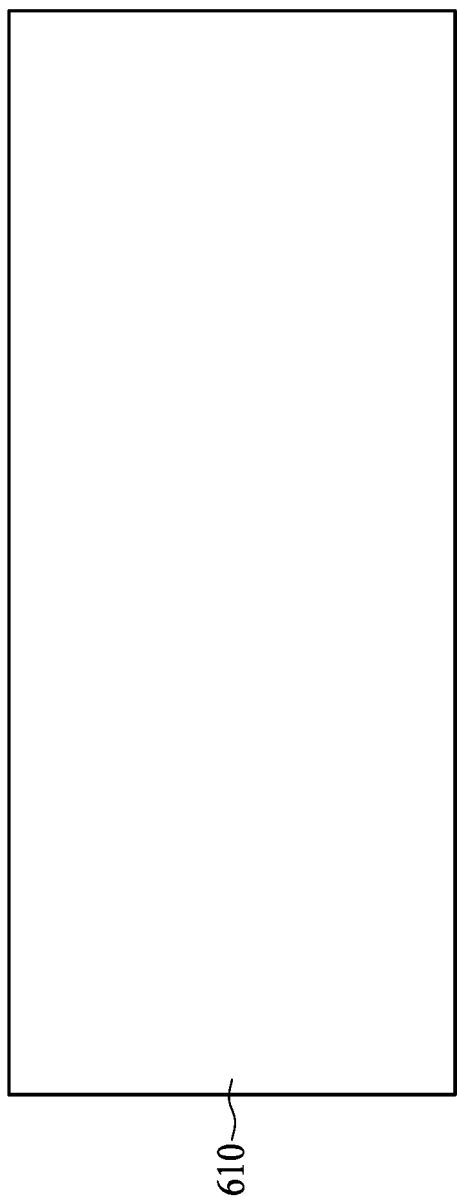
FIGS. 6A to 6H are diagrams illustrating a flow of manufacturing a vertical three dimensional semiconductor device in accordance with an embodiment of the present disclosure.

In FIG. 6A, a substrate 610 is provided. In some embodiments of the present disclosure, the material of the substrate 610 may include, but is not limited to, elementary semiconductor such as silicon or germanium; a compound semiconductor such as silicon germanium, silicon carbide, gallium arsenic, gallium phosphide, indium phosphide or indium arsenide; or combinations thereof.

Figure 6B:
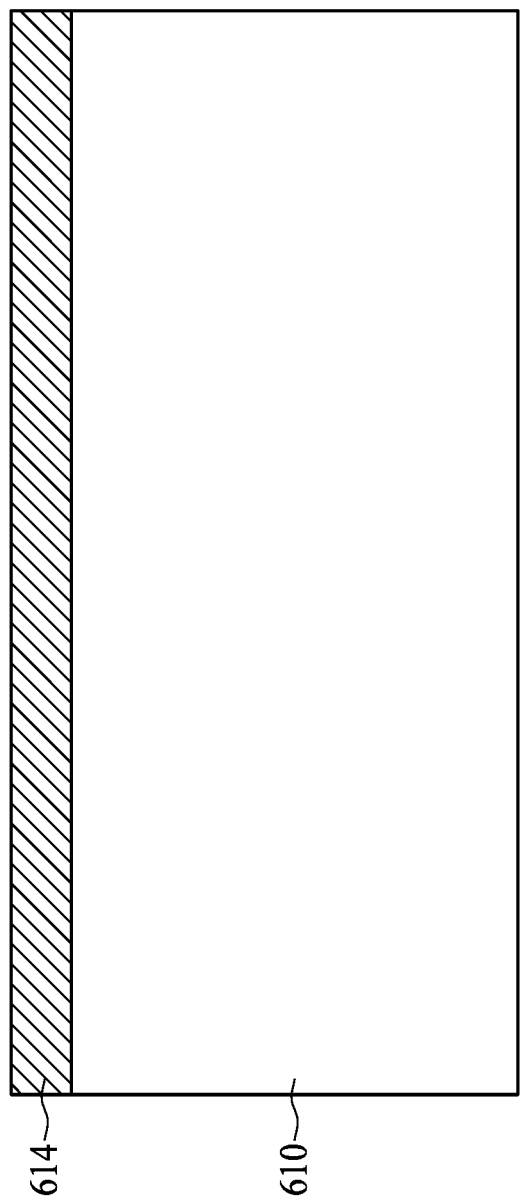

In FIG. 6B, a gate electrode layer 614 is deposited on the substrate 610. The gate electrode layer 614 is a conductive layer and may comprise any conductive material such as for example polysilicon or a metal. The metal for the gate electrode layer 614 may be chosen from a group consisting of Cu, Al, Ti, W, Ni, Au, TiN, TaN, TaC, NbN, RuTa, Co, Ta, Mo, Pd, Pt, Ru, Ir and Ag, to name a few.

In some embodiments of the present disclosure, the gate electrode layer 614 is formed by, for example, atomic layer deposition (ALD), physical vapor deposition (PVD), chemical vapor phase deposition (CVD), more preferably, low pressure CVD (LPCVD) or alternatively plasma enhanced CVD (PECVD).

Figure 6C:
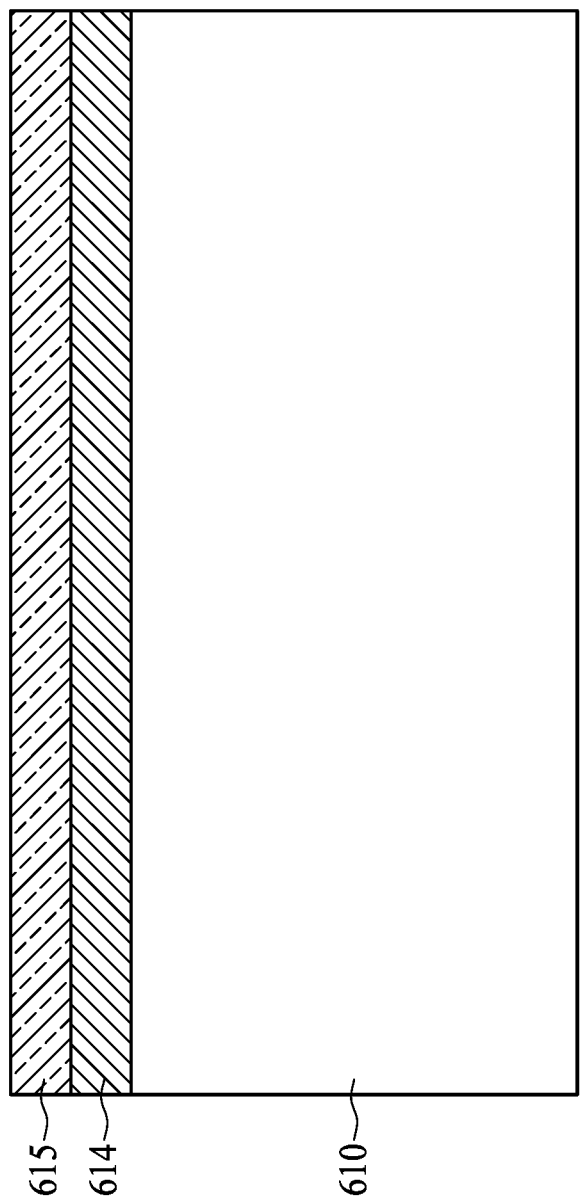

In FIG. 6C, an insulating layer 615 is formed on the gate electrode 614. In some embodiments of the present disclosure, the insulating layer 615 may comprise a dielectric material suitable for electrically isolating adjacent gate electrode layers 614, such as SiOx (e.g., SiO2), SiNx (e.g., Si3N4), SiOxNy, Al2O3, AN, MgO and carbides or a combination thereof, to name a few. The insulating layer 615 may also comprise low-k dielectric materials such as for example carbon doped silicon oxide, porous silicon oxide, or might be comprising an air or vacuum (airgap) region.

In some embodiments of the present disclosure, the insulating layer 615 is formed by, for example, atomic layer deposition (ALD), physical vapor deposition (PVD), chemical vapor phase deposition (CVD), more preferably, low pressure CVD (LPCVD) or alternatively plasma enhanced CVD (PECVD).

Figure 6D:
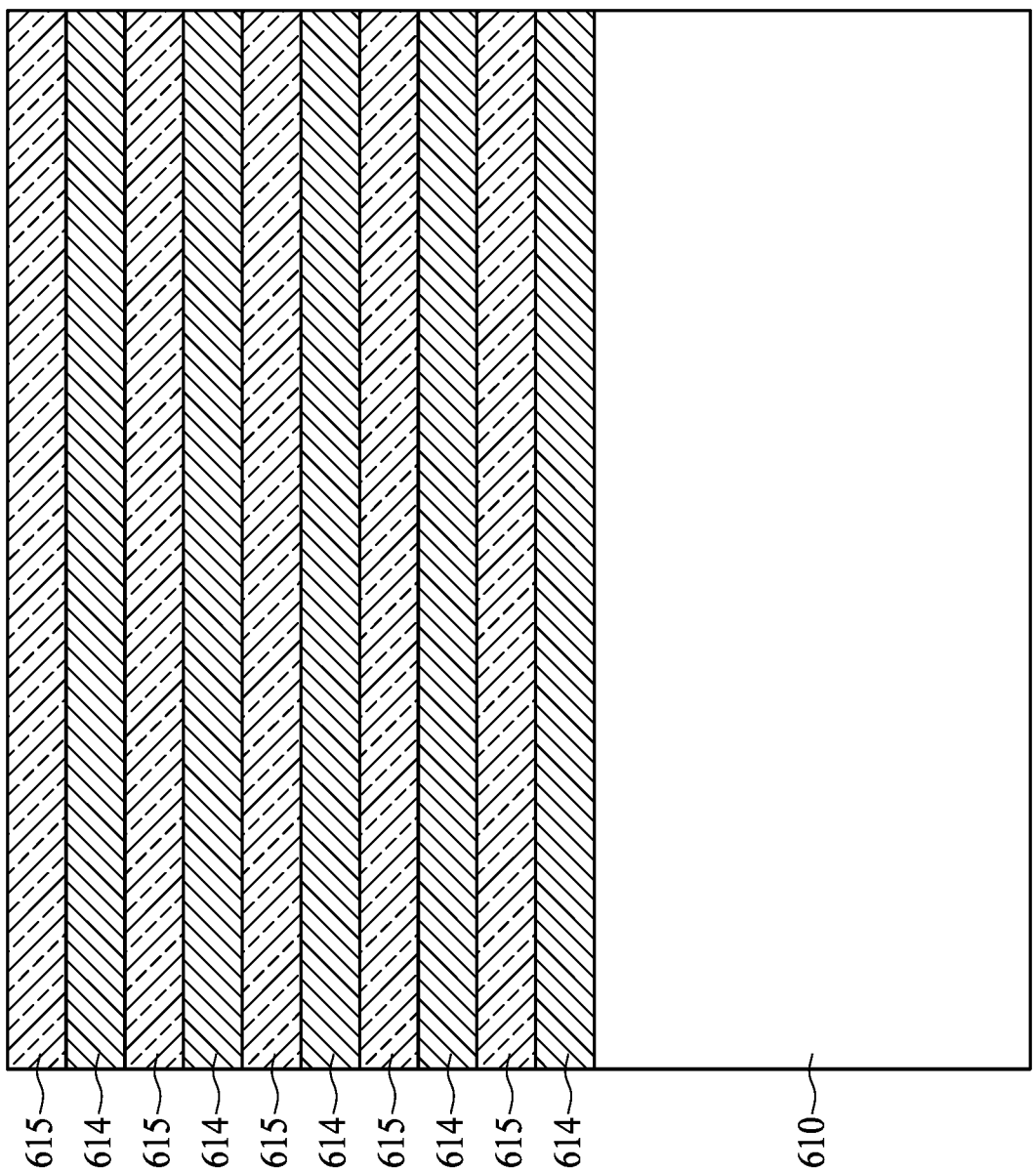

In FIG. 6D, the gate electrode layer 614 and the insulating layer 615 are alternatively stacked.

Figure 6E:
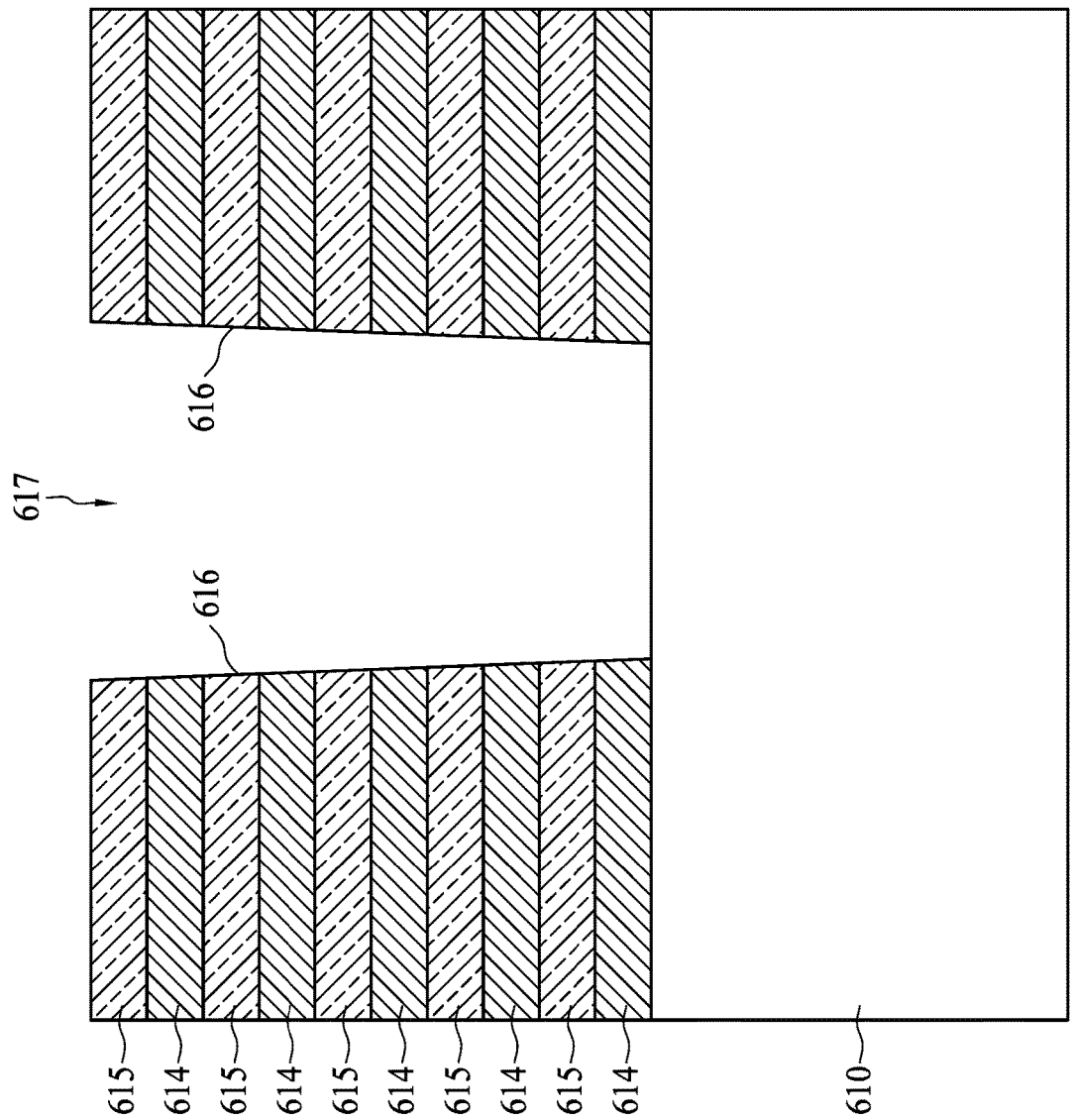

In FIG. 6E, a trench 617 penetrating through the stack of the gate electrode layer 614 and the insulating layer 615 is generated to expose a top surface of the substrate 610. The trench 617 including a sidewall 616 is generated by, for example, a photolithography operation.

Figure 6F:
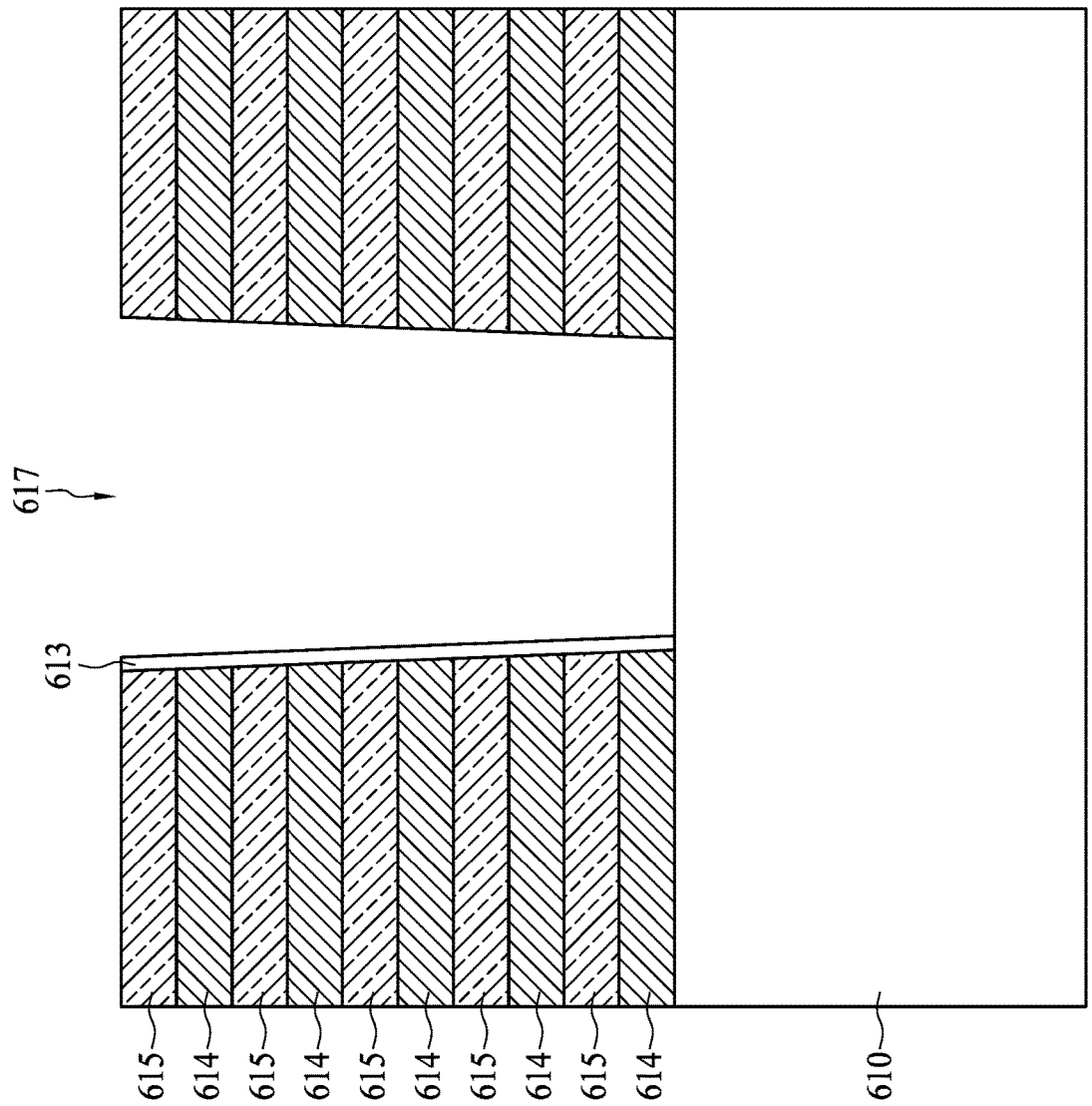

In FIG. 6F, a ferroelectric material layer 613 is deposited on a part of the sidewall 616 of the trench 617. In some embodiments of the present disclosure, the ferroelectric material layer 613 occupies 25% to 75% of the sidewall 616. In some embodiments of the present disclosure, the ferroelectric material layer 613 is deposited by, for example, atomic layer deposition (ALD).

Figure 6G:
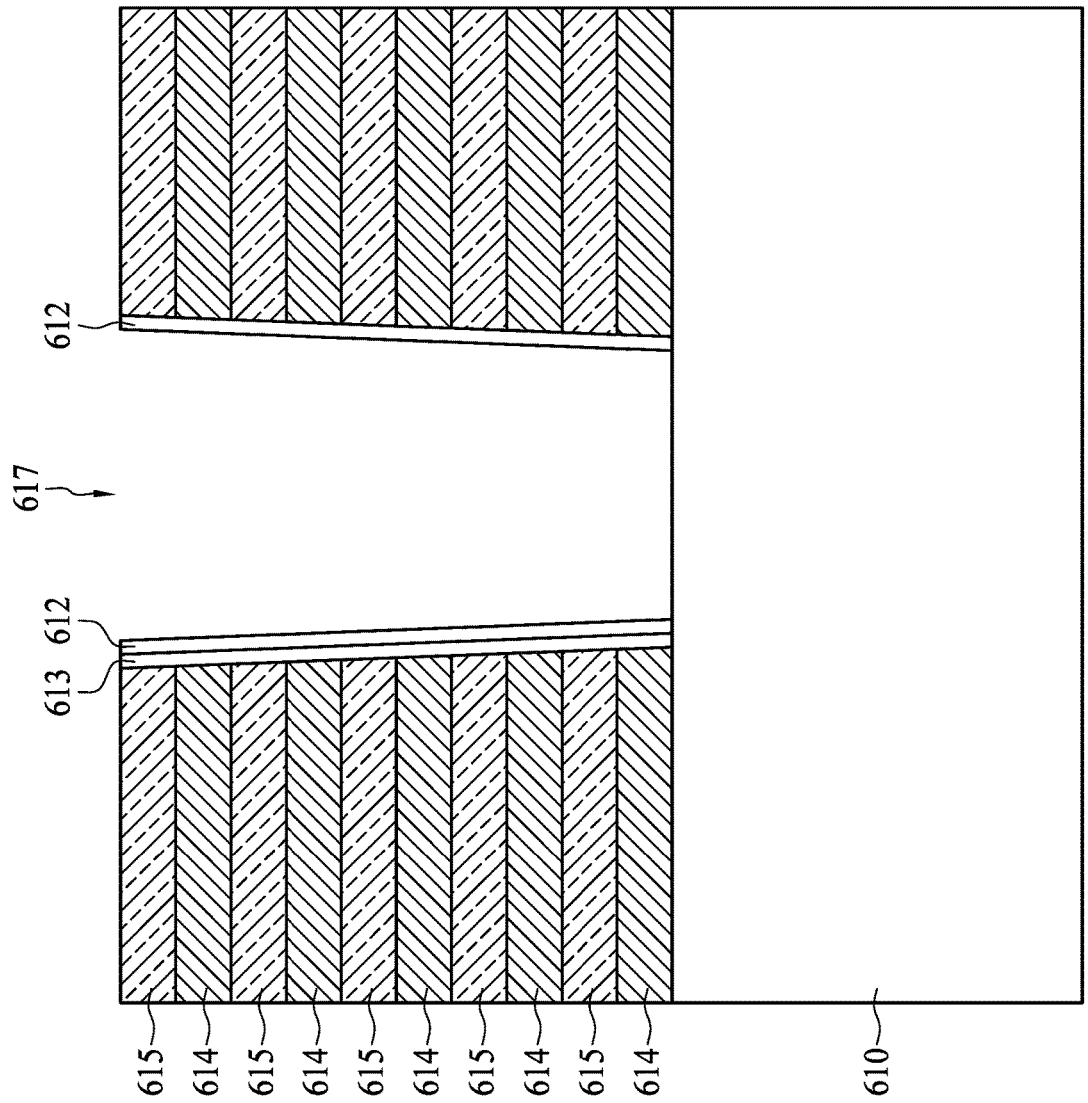

In FIG. 6G, an oxide layer 612 is deposited around the sidewall 616 of the trench 617. Because the ferroelectric material layer 613 is deposited on a part of the sidewall 616 first, a part of the oxide layer 614 does not contact the sidewall 616. After depositing the oxide layer 612 around the sidewall 616, the ferroelectric material layer 613 surrounds 25% to 75% of the oxide layer 612.

Figure 6H:
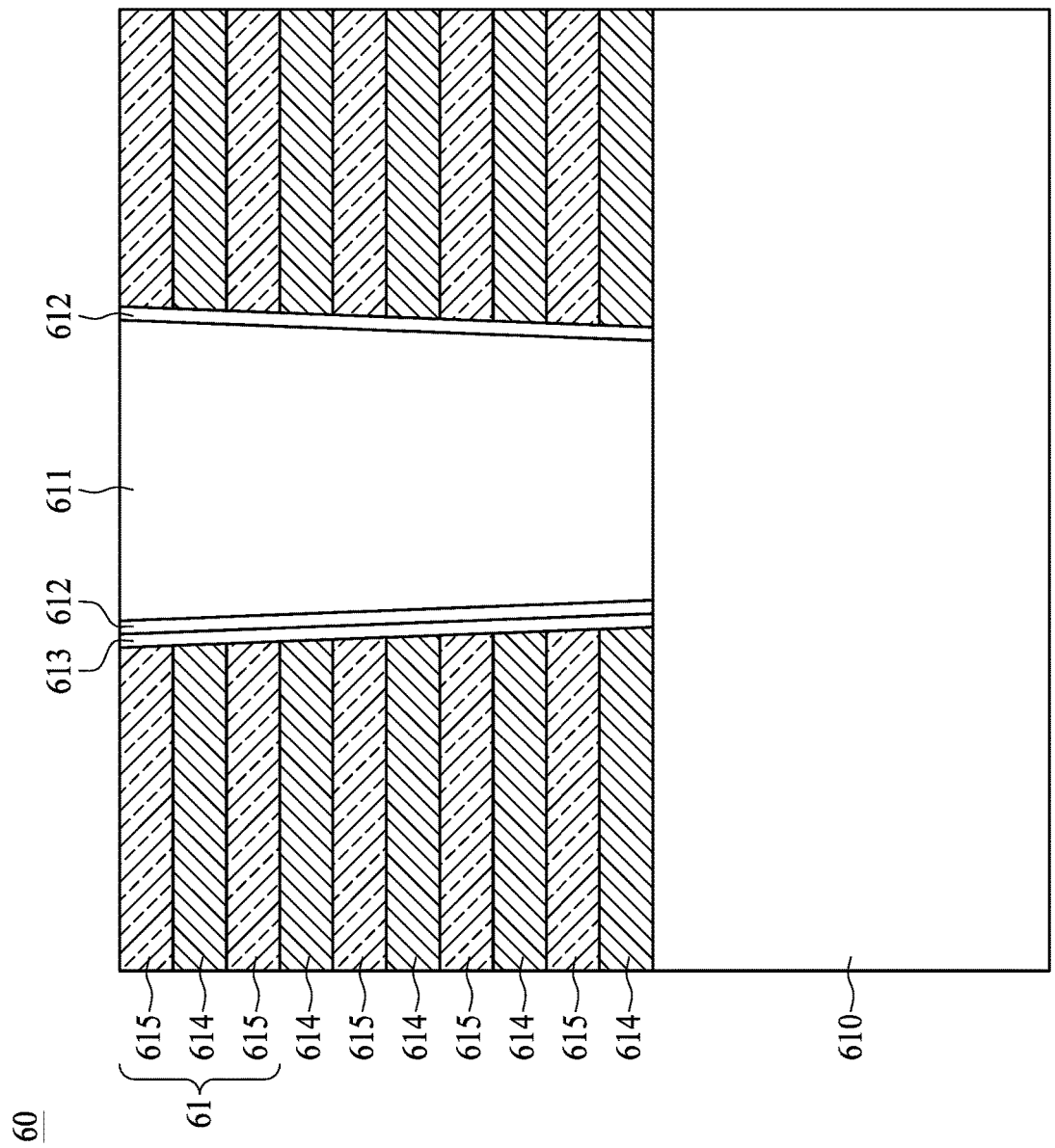

In FIG. 6H, a channel layer 611 is formed in the trench 617. The semiconductor device 60 including a plurality of memory cells 61 is thus formed.

The gate electrode layer 614, the ferroelectric material layer 613, the oxide layer 612 and the channel layer 611 constitute a FeFET and a FeCAP. The gate electrode layer 614, the oxide layer 612 and the channel layer 611 constitute another transistor which shares the gate terminal, the source terminal and the drain terminal with the FeFET. Therefore, the transistor whose gate terminal is composed by the gate electrode layer 614, the oxide layer 612 and the channel layer 611 can be considered as the second transistor 113 shown in FIG. 1.

Figure 7:
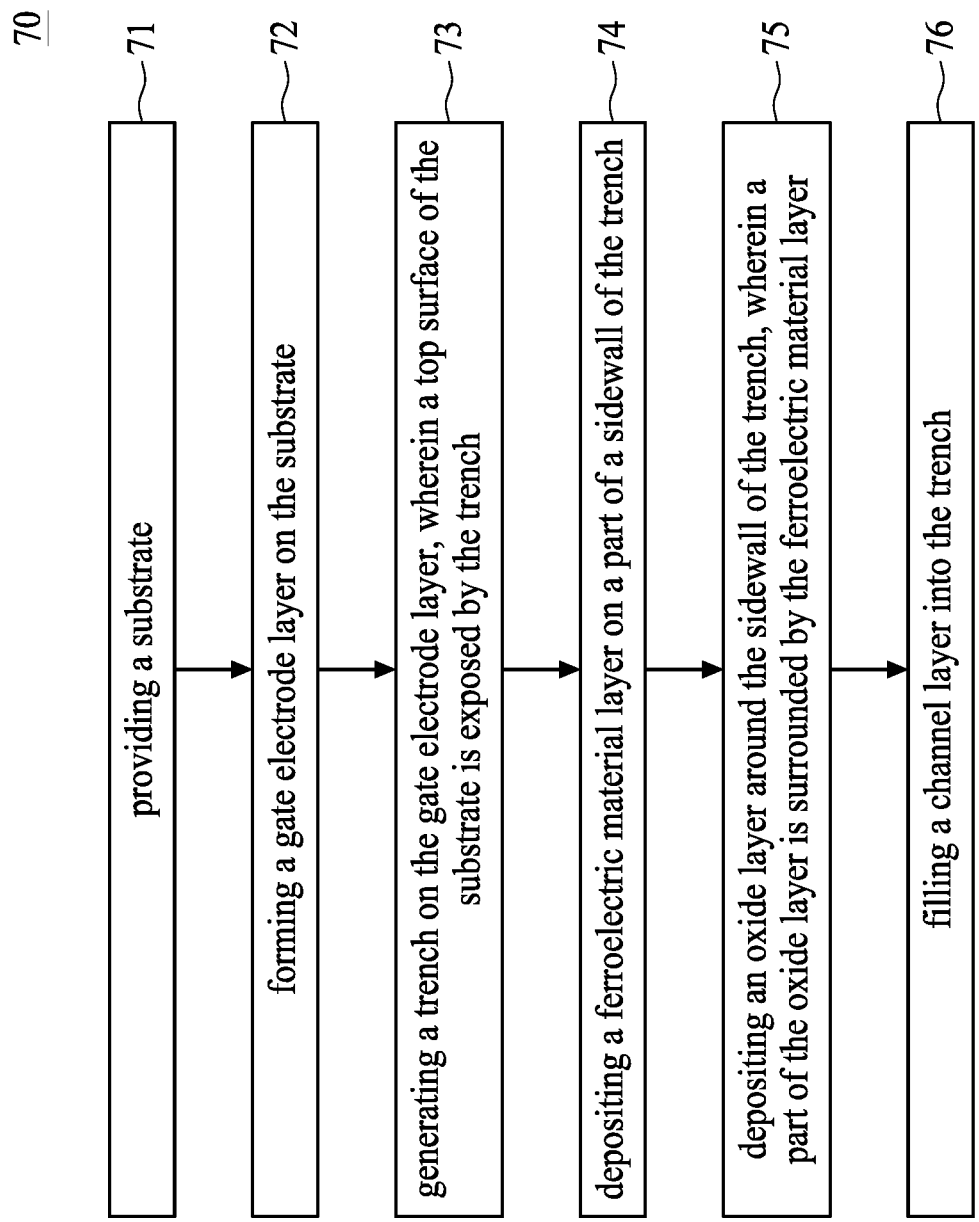
FIG. 7 is a flowchart illustrating a method of manufacturing a semiconductor device in accordance with an embodiment of the present disclosure.

FIG. 7 is a flowchart illustrating a method 70 of manufacturing a semiconductor device in accordance with an embodiment of the present disclosure. The method 70 can be adopted to manufacture the semiconductor device 60 described in the embodiments of FIGS. 6A to 6H. Provided that the results are substantially the same, the operations in method 70 are not required to be executed in the exact order. The method 70 is summarized as follows.

In Operation 71, a substrate is provided. In some embodiments of the present disclosure, the substrate is a semiconductor substrate such as e.g. a silicon, a gallium arsenide (GaAs), a gallium arsenide phosphide (GaAsP), an indium phosphide (InP), a germanium (Ge), or a silicon germanium (SiGe) substrate. In other embodiments the substrate may include for example, an insulating layer such as a SiO2 or a Si3N4 layer in addition to a semiconductor substrate portion. Thus, the term substrate also includes silicon-on-glass, silicon-on-sapphire substrates. Also, the substrate may be any other base on which a layer is formed, for example a glass or metal layer. Accordingly, a substrate may be a wafer such as a blanket wafer or may be a layer applied to another base material, e.g. an epitaxial layer grown onto a lower layer.

In Operation 72, a gate electrode layer is formed on the substrate. The gate electrode layer is a conductive layer and may comprise any conductive material such as for example polysilicon or a metal. The metal for the gate electrode layer may be chosen from a group consisting of Cu, Al, Ti, W, Ni, Au, TiN, TaN, TaC, NbN, RuTa, Co, Ta, Mo, Pd, Pt, Ru, Ir and Ag, to name a few.

In some embodiments of the present disclosure, the gate electrode layer is formed by, for example, atomic layer deposition (ALD), physical vapor deposition (PVD), chemical vapor phase deposition (CVD), more preferably, low pressure CVD (LPCVD) or alternatively plasma enhanced CVD (PECVD).

In Operation 73, a trench is generated on the gate electrode layer, wherein a top surface of the substrate is exposed by the trench. The trench including a sidewall is generated by, for example, a photolithography operation.

In Operation 74, a ferroelectric material layer is deposited on a part of the side wall of the trench. In some embodiments of the present disclosure, the ferroelectric material layer occupies 25% to 75% of the sidewall.

In some embodiments of the present disclosure, the ferroelectric material layer is deposited by, for example, atomic layer deposition (ALD).

In Operation 75, an oxide layer is deposited around the sidewall of the trench, wherein a part of the oxide layer is surrounded by the ferroelectric material layer.

In Operation 76, a channel layer is filled into the trench.

In some embodiments of the present disclosure, a method of manufacturing a semiconductor device is disclosed. The method includes: providing a substrate including a planar portion and a mesa portion over the planar portion; depositing an oxide layer over the mesa portion; depositing a ferroelectric material strip over the oxide layer and aligned with the mesa portion; and depositing a gate strip crossing the ferroelectric material strip and over the oxide layer.

In some embodiments of the present disclosure, a method of manufacturing a semiconductor device is disclosed. The method includes: depositing a plurality of gate electrode layers and a plurality of insulating layer alternatively arranged with the plurality of gate electrode layers over a substrate; etching a trench through the plurality of gate electrode layers and the plurality of insulating layers; depositing a ferroelectric material layer on a first sidewall of the trench while exposing a second sidewall of the trench; and depositing an oxide layer over the first sidewall and the second sidewall.

In some embodiments of the present disclosure, a memory device is disclosed. The semiconductor device includes a plurality of memory cells connected together, each of the plurality of memory cells including a first transistor, a second transistor and a capacitor, wherein the first transistor and the second transistor share a channel region, an oxide layer arranged over the channel region, and a ferroelectric material strip arranged over the oxide layer. The memory device further includes a selection transistor connected to one end of the plurality of memory cells in series.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   providing a substrate including a planar portion and a mesa portion over the planar portion;
   depositing an oxide layer over the mesa portion;
   depositing a ferroelectric material strip over the oxide layer and aligned with the mesa portion; and
   depositing a gate strip crossing the ferroelectric material strip and over the oxide layer.

2. The method of claim 1, wherein the providing of the substrate comprises executing a photolithography operation upon the substrate to form the planar portion and the mesa portion.

3. The method of claim 1, wherein the depositing of the oxide layer comprises electroplating the oxide layer on the substrate to cover the planar portion and the mesa portion.

4. The method of claim 1, wherein the depositing of the oxide layer comprises executing an atomic layer deposition, a physical vapor deposition, a chemical vapor phase deposition (CVD), a low pressure CVD or a plasma-enhanced CVD to form the oxide layer.

5. The method of claim 1, wherein the depositing of the ferroelectric material strip over the oxide layer comprises electroplating a ferroelectric material upon a topmost surface of the oxide layer to form the ferroelectric material strip.

6. The method of claim 1, wherein the depositing of the ferroelectric material strip over the oxide layer comprises executing an atomic layer deposition, a physical vapor deposition, a chemical vapor phase deposition (CVD), a low-pressure CVD (LPCVD) or a plasma-enhanced CVD (PECVD) to form the ferroelectric material strip.

7. The method of claim 1, wherein the depositing of the ferroelectric material strip over the oxide layer comprises:
   depositing a ferroelectric material layer upon the oxide layer; and
   shaping the ferroelectric material layer to include a side plane and a bottom plane of the oxide layer free from being covered by the ferroelectric material layer.

8. The method of claim 7, wherein the shaping of the ferroelectric material layer comprises:
   disposing a photomask above a part of the ferroelectric material layer, wherein the part of the ferroelectric material layer is located above a topmost surface of the oxide layer; and
   executing a photolithography operation upon the ferroelectric material layer to form the ferroelectric material strip.

9. The method of claim 1, wherein an angle between a side surface of the mesa portion and the planar portion is in a range between about 70 degrees and about 90 degrees.

10. The method of claim 1, wherein a length of a side plane of the mesa portion along which the substrate extends is in a range between about 15 nm and about 80 nm.

11. The method of claim 1, wherein the ferroelectric material strip and the gate strip extend in a first direction and a second direction, respectively, and the first direction is orthogonal to the second direction.

12. The method of claim 1, wherein a length of the planar portion arranged on one side of the mesa portion and measured in a first direction perpendicular to a second direction in which the substrate is in a range between about 15 nm and about 50 nm.

13. The method of claim 1, wherein a length of a top surface of the mesa portion measured in a first direction perpendicular to a second direction in which the substrate extends is in a range between about 15 nm and about 50 nm.

14. The method of claim 1, wherein a thickness of a topmost surface of the oxide layer is in a range between about 1 nm and about 6 nm.

15. The method of claim 1, wherein a thickness of a side plane of the oxide layer is in a range between about 1 nm and about 6 nm.

16. The method of claim 1, wherein a thickness of a bottom plane of the oxide layer is in a range between about 15 nm and about 50 nm.

17. A method of manufacturing a semiconductor device, comprising:
   depositing a plurality of gate electrode layers and a plurality of insulating layer alternatively arranged with the plurality of gate electrode layers over a substrate;
   etching a trench through the plurality of gate electrode layers and the plurality of insulating layers;
   depositing a ferroelectric material layer on a first sidewall of the trench while exposing a second sidewall of the trench; and
   depositing an oxide layer over the first sidewall and the second sidewall.

18. The method of claim 17, further comprising filling a channel layer into the trench.

19. The method of claim 17, wherein the ferroelectric material layer surrounds 25% to 75% of a sidewall of the oxide layer.

20. A memory device, comprising:
   a plurality of memory cells connected together, each of the plurality of memory cells including a first transistor, a second transistor and a capacitor, wherein the first transistor and the second transistor share a channel region, an oxide layer arranged over the channel region, and a ferroelectric material strip arranged over the oxide layer; and
   a selection transistor connected to one end of the plurality of memory cells in series.

* * * * *